United States Patent [19]

Hasenkopf et al.

[11] Patent Number: 4,694,415
[45] Date of Patent: Sep. 15, 1987

[54] ADAPTIVE DIGITAL FILTER FOR ANALOG INPUT SIGNALS

[75] Inventors: Joel E. Hasenkopf, Allison Park; James F. Sutherland, Plum Borough, both of Pa.

[73] Assignee: Westinghouse Electric Corp., Pittsburgh, Pa.

[21] Appl. No.: 729,397

[22] Filed: May 1, 1985

[51] Int. Cl.⁴ .............................................. G06F 15/31
[52] U.S. Cl. .................................................... 364/724
[58] Field of Search ........................ 364/724; 375/103; 455/299

[56] References Cited

U.S. PATENT DOCUMENTS

| | | | |
|---|---|---|---|
| 3,573,727 | 4/1971 | Freeny | 371/6 |
| 3,889,108 | 6/1975 | Cantrell | 364/724 |
| 3,908,115 | 9/1975 | Waggener | 364/553 |
| 4,106,102 | 8/1978 | Desblache | 364/724 |
| 4,320,535 | 3/1982 | Brady et al. | 455/278 |
| 4,344,150 | 8/1982 | McLaughlin | 364/724 |
| 4,416,017 | 11/1983 | Jasper et al. | 375/99 |
| 4,420,815 | 12/1983 | Francis | 364/724 |
| 4,458,355 | 7/1984 | Motley et al. | 375/82 |
| 4,589,083 | 5/1986 | Dinh et al. | 364/724 |

Primary Examiner—David H. Malzahn
Attorney, Agent, or Firm—Daniel C. Abeles

[57] ABSTRACT

An adaptive digital filter is supplied with an alternating current noise signal by a separate reference line. The filter samples input signals and the signal on the reference line several times during each cycle of the noise signal. The samples of each of the input signals are then summed and optionally averaged for one cycle of the noise signal to produce filtered signals. The sampling interval for the input and reference signals is adjusted so that the sum of the reference signal samples for one cycle of the noise signal approaches zero.

13 Claims, 3 Drawing Figures

ADAPTIVE DIGITAL FILTER FOR ANALOG INPUT SIGNALS

BACKGROUND OF THE INVENTION

1. Field of the Invention

The present invention relates in general to adaptive digital filters for analog inputs; and more particularly, to an adaptive digital filter for eliminating alternating current noise from a direct current analog input signal in the control system of a pressurized light water nuclear power system.

2. Description of the Related Art

Adaptive digital filters are commonly used to perform many types of filtering when the signal to be filtered varies over time. For example, U.S. Pat. No. 4,106,102 to Desblache discloses a self-adaptive digital filter for noise and phase jitter reduction which is used with sinusoidal input signals. The filter described in Desblache is a narrow bandwidth filter for accepting or rejecting the undesired signal(s). In Desblache, the center frequency of the narrow bandpass filter is adjusted to follow variations in the input signal by separating the filtered signal into quadrature components, generating mutually in-quadrature components from the quadrature components and then generating an error signal from the quadrature and mutually in-quadrature components.

An apparatus for removing "phase jitter" was disclosed in Desblache utilizing the above-described filter. A similar problem, that of determining accurate timing differences between pulse periodic signals used in a LORAN C navigation system, is described in U.S. Pat. No. 4,416,017 to Jasper et al. In Jasper et al., the frequency of interfering signal is determined using an autocorrelation function and a phase-locked loop is used to adjust the sampling of pulsed periodic signals generated by LORAN C transmitters.

A different technique for attenuating interference is disclosed in U.S. Pat. No. 4,320,535 to Brady et al. A microwave receiving station for satellite transmissions is disclosed in Brady et al. which includes an auxiliary antenna aligned to receive an interfering signal. The signal received by the auxiliary antenna is passed through a quadrature modulator to adjust its amplitude to match that of the interference signal received by the main antenna and to shift its phase so that the signal output by the quadrature modulator can be combined with the signal received by the main antenna in a hybrid circuit which cancels the interference signal received by the main antenna.

One of the most common sources of noise in electrical systems is generated by alternating current power supplies. The expected or nominal frequency of conventional alternating current power supplies is normally 60 cycles per second in North America and normally 50 cycles per second in Europe. However, the actual frequency may vary over a range as large as ±5%, for example when a diesel generator is used to supply power. Furthermore, the frequency may differ from location to location even within a single installation, such as in a pressurized light water nuclear power plant in which more than one diesel generator is installed. Therefore, input lines carrying direct current analog input signals from a first location to a second location may be subjected to "power line hum" of a different frequency than that which is present at the second location. Conventional filters for removing power line hum sense the frequency of their local power supply which may have a different frequency than that which is present on the input lines. Such filters can be ineffective and potentially result in a reduction in the quality of the input signals.

An alternative conventional filter utilizes analog components to filter out the alternating current noise signal from the direct current input signals. However, filters using analog components are relatively slow to respond to sudden changes in the level of the input signals. Thus, a short and sudden fluctuation in a measured condition may be undetected by control systems which use this type of conventional analog filter.

SUMMARY OF THE INVENTION

An object of the present invention is to provide an adaptive digital filter, for alternating current noise signals, which overcomes the drawbacks of the prior art.

Another object of the present invention is to provide an adaptive digital filter for sampling noise signals at a sampling rate which is chosen to minimize the sum of the noise signal samples.

Yet another object of the present invention is to provide an adaptive digital filter which receives a signal containing only noise.

A further object of the present invention is to provide an adaptive digital filter in which the sampling rate is selected so that the number of samples during one cycle of a noise signal is a multiple of two.

A still further object of the present invention is to provide an adaptive digital filter having a sampling rate which is changed as a function of the largest amount of error detected during each cycle of a noise signal.

The above-mentioned objects can be obtained by providing an adaptive digital filter comprising a reference line which supplies a reference signal indicating the frequency of a noise signal, a sampling circuit for receiving and sampling input and reference signals and for generating input and reference samples and a processor for producing a sum of the reference samples generated during one cycle of the noise signal, for adjusting the sampling rate when the sum is not equal to zero and for summing the input signal over one cycle of the noise to remove same.

These objects, together with other objects and advantages which will be subsequently apparent, reside in the details of the construction and operation as more fully hereinafter described and claimed, reference being had to the accompanying drawings forming a part hereof, wherein like reference numerals refer to like parts throughout.

DESCRIPTION OF THE PREFERRED EMBODIMENTS

An adaptive digital filter according to the present invention filters an alternating current noise signal out of direct current input signals by closely monitoring the alternating current noise signal and summing the input signal samples for an exact multiple of cycles of the noise signal, preferably one cycle. The sum of each of the input signals can then be averaged by dividing by the number of samples during one cycle or otherwise processing the result, such as scaling, coding, etc., prior to being output. The summing as well as the averaging of the direct current input signals over the exact cycle length of the sinusoidal noise signal removes the noise because the average of the noise equals zero or the sum of samples of a sinusoidal signal equals zero. However, fluctuations occur in conventional alternating current power supply systems and the frequency may vary by as much as ±5% when generated by emergency diesel generators. Therefore, it is necessary to monitor the frequency of the noise signal generated by alternating current power line, so that averaging over one cycle is possible. According to the present invention, the sampling interval is changed to reflect changes in the frequency of the noise signal by adding or subtracting a correction factor at the end of each cycle of the noise signal.

Figure 1:
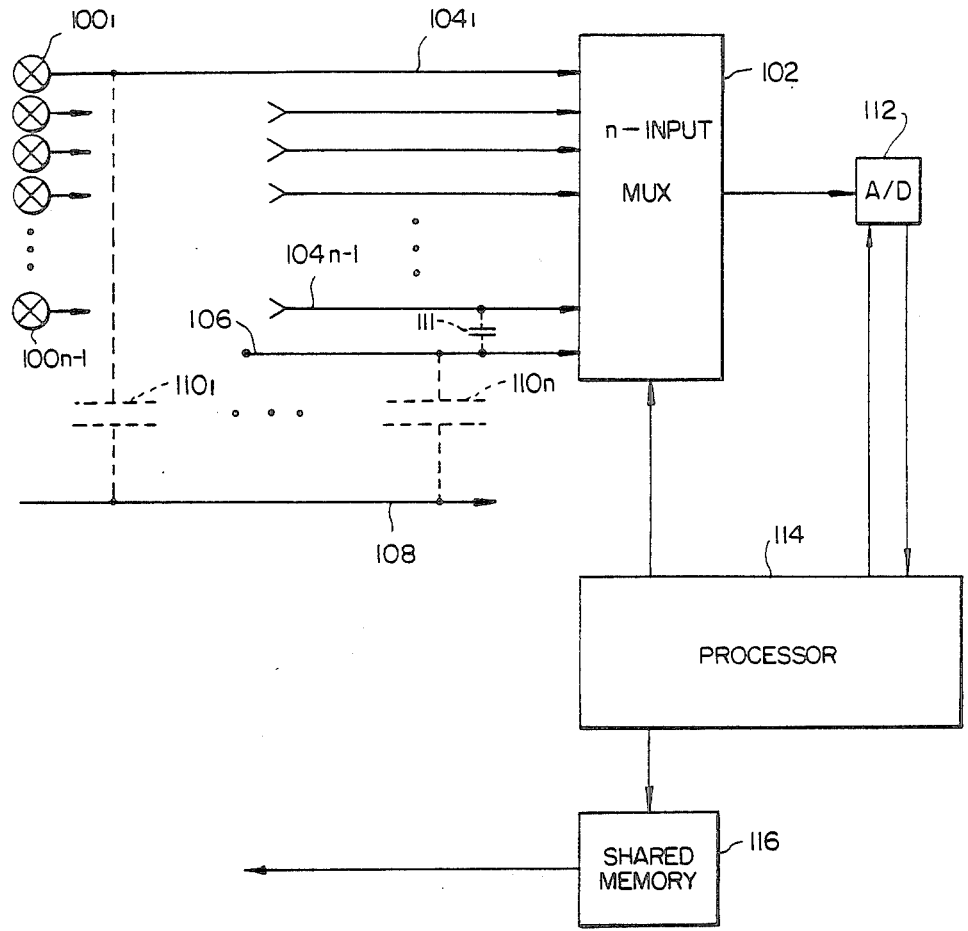
FIG. 1 is a block diagram of an embodiment of the present invention.

An adaptive digital filter according to the present invention is illustrated in FIG. 1. Analog input signals are output by sensors $100_1$–$100_{n-1}$ to an n-input multiplexer 102 via analog input lines $104_1$–$104_{n-1}$. The nth input of the n-input multiplexer 102 is connected to a reference input line 106. All n of the input lines $104_1$–$104_{n-1}$ and 106 are exposed to alternating current noise signals from a power source 108 via inherent coupling capacitances $110_1$–$110_n$, respectively. In the preferred embodiment, the multiplexer 102 will be assumed to be a 16-input multiplexer, such as a 0508A manufactured by Harris Semiconductor. Therefore, the multiplexer 102 will receive 15 input signals and one reference signal.

In the preferred embodiment, the input lines $104_1$–$104_{n-1}$ are shielded and separate unshielded reference line 106 is used. However, if the input lines $104_1$–$104_{n-1}$ are not shielded, the reference signal input of the multiplexer 102 could alternately be coupled to one of the input lines $104_1$–$104_{n-1}$ via a capacitor 111.

The multiplexer 102 outputs a voltage level corresponding to one of the 16 inputs to an analog/digital converter 112, under the control of a processor 114, such as an 8088 manufactured by Intel. The analog/digital converter 112 may be implemented as a subsystem constructed from a DAC80, manufactured by Analog Devices, and an AM2504 successive approximation register, manufactured by Advanced Microdevices. The analog/digital converter 112 can be calibrated using a known direct current voltage switched via a relay on to the reference line 106.

The multiplexer 102 and analog/digital converter 112 are controlled by the processor 114 to sample all 16 of the inputs lines $104_1$–$104_{n-1}$ and 106 at a sampling rate which is determined in accordance with the frequency of the alternating current noise signal received by the reference input line 106. Thereby, the digital representation of the input signals can be summed, and if desired averaged, for one cycle of the noise signal and stored in a shared memory 116, such as two 2114 static RAM chips which are included on an iSBC-8840 board along with an 8088 processor, manufactured by Intel. In the case of a pressurized light water nuclear power system, the sensors $100_1$–$100_{n-1}$ are typically located in containment and the averaged (i.e., filtered) input signals stored in the shared memory 116 are supplied to a protection or control system.

Figure 2:
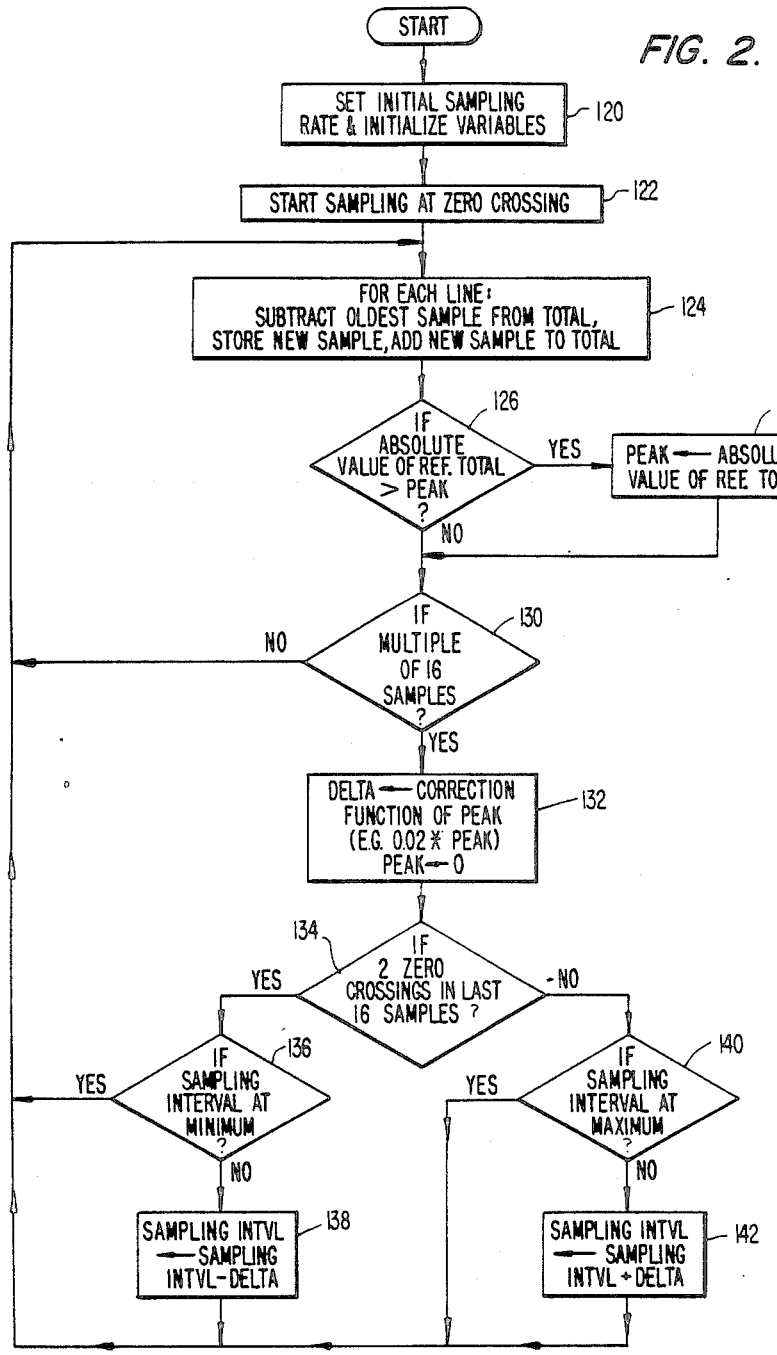
FIG. 2 is a flowchart of a method according to the present invention.

A flowchart of a program executed by the processor 114 to control the sampling of the input and reference signals is illustrated in FIG. 2. After setting an initial sampling rate and initializing the variables used in the program (block 120), sampling is initiated in block 122. Preferably, the sampling is started at a zero crossing of the alternating current noise signal by detecting a change in the sign of the reference signal on line 106 (FIG. 1), or as indicated by a zero crossing detector connected to the reference input line 106. However, if little noise is received by the reference input line 106, a zero crossing may not be detected. Therefore, the program instructions represented by block 122 should include a test which initiates sampling of the input lines $104_1$–$104_{n-1}$ and 106 if a zero crossing is not detected prior to the elapse of a specific amount of time, such as two or three times the expected period of the noise signal. Also included in the program instructions represented by block 122 (or 120) is the sampling of line 106 at least 16 times so that the peak value calculations, described below, are correct for the first sampling period.

Sampling is performed for each of the input lines $104_1$–$104_{n-1}$ and 106 by controlling the multiplexer 102 to output a received input signal on a selected input line to the analog-digital converter 112 and reading the digital representation of the received input signal. The processor 114 utlilzes a 16 point running sum filtering method by maintaining a record of the most recent 16 values received by each of the input lines $104_1$–$104_{n-1}$ and 106 as well as the total of the values stored for each of the input lines $104_1$–$104_{n-1}$ and 106. When a line is sampled, as indicated in block 124, the value of the oldest sample is subtracted from the total for the corresponding input line and the new sample is stored in its place and added to the just calculated 15 sample total to form a new 16 sample total. Averaged signals may be generated at this time, only at the end of each cycle or after a predetermined number of cycles, depending on how often the output of the filter is read and how much time is left for averaging after all other calculations and sampling is completed.

After sampling each of the input lines $104_1$–$104_{n-1}$ and 106, the absolute value of the reference total is compared in block 126 with a previous peak value of the reference total and if the absolute value of the current reference total is larger, the peak value is updated in block 128. After 16 samples have been taken (block 130), the accuracy of the sampling rate is checked. Sixteen samples per cycle of the noise signal are used in this embodiment to simplify the averaging of the input signals, since division by 16 can easily be performed by a four-bit binary shift to the right. The number of bits in a sampled signal, e.g., twelve, and in the total, e.g., sixteen, therefore are chosen so that after four bits are shifted in the division operation, there is sufficient precision in the resulting average.

A correction factor DELTA to correct for differences between the period of the noise and 16 times the sampling interval is calculated in block 132 as a function of the peak value of the absolute value of the reference signal total. In this embodiment, DELTA=0.02 times the peak value. The multiplication factor 0.02 was chosen during experimentation and resulted in convergence of 16 times the sampling interval and the period of the noise in only 13 cycles of the noise in one experiment. The multiplication factor should be selected to provide convergence by avoiding overdamping and underdamping, based on the expected variation in the frequency of the noise signal.

After calculating the correction factor DELTA and re-initializing the peak value to zero, a check is made on whether two zero crossings (sign changes) were detected during the previous 16 samples in block 134. If two zero crossings were detected, indicating one cycle of noise, a check is made in block 136 to determine whether the sampling interval is already at a minimum value. Since several lines have to be sampled and other calculations performed, an absolute minimum sampling interval is determined by the speed of the processor. In addition, the freqency of the noise signal is usually known within a given tolerance, e.g., ±5% of 60 cyles per second and the minimum sampling interval should small enough to provide, in this case, 16 samples at the highest expected frequency. Assuming the sampling interval is not at the minimum, the sampling interval is reduced by the amount of the correction factor DELTA (block 138) and another 16 samples are made in blocks 124–130.

It is also possible that no significant alternating current noise signal is received by the reference line 106 and thus, no zero crossings would be detected. To allow for this possibility, a maximum sampling interval is established which ensures that new input sample sums are generated sufficiently often to quickly detect changes in the input signals. Thus, the maximum interval may be determined by the rate at which the output of the filter is read or in the described embodiment, simply 5% to 10% larger than the expected interval. If the check in block 134 determines that two zero crossings were not detected in the previous 16 samples, the sampling interval is checked against a maximum value in block 140 and increased by the correction factor DELTA in block 142, assuming that the sampling interval is not at a maximum.

Figure 3:
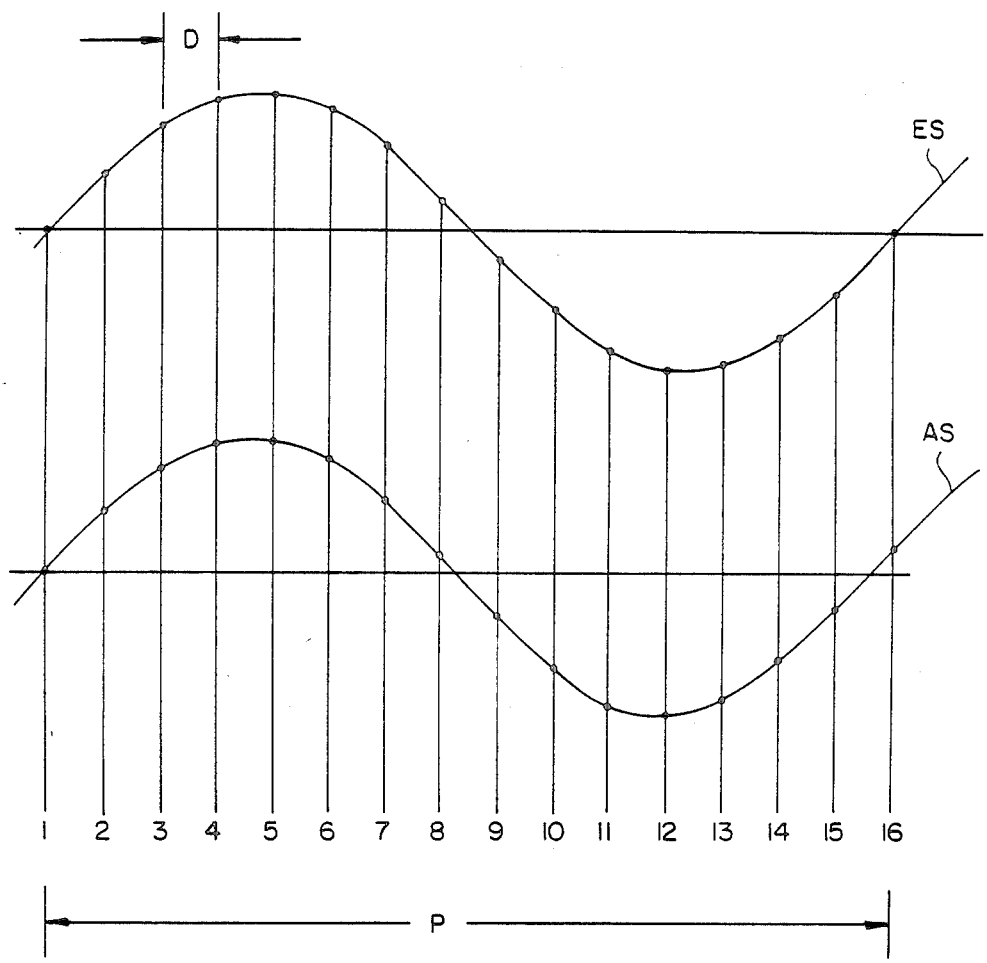
FIG. 3 is a graphical representation of the sampling of sinusoidal signals.

In the case of a nuclear power system, the frequency of the noise signal is expected to be 50 or 60 cycles per second (depending on whether the system is in Europe or North America, respectively). An expected noise signal ES is illustrated in FIG. 3 with a period P of 16.67 milliseconds (60 cycles per second). Thus, the initial sampling interval D is approximately 1.04 milliseconds. However, as illustrated in FIG. 3, the actual signal AS received on the reference input line 106 may have a frequency which is different from the expected frequency. As a result, the initial sampling interval D is too large. Referring to the flowchart in FIG. 2, block 132 would calculate a correction factor DELTA. The test in block 134 would indicate that two zero crossings had been detected (between samples 8 and 9 and samples 15 and 16).

Assuming the sampling interval is not at a minimum, block 138 would decrease the sampling interval by the amount of the correction factor DELTA. Assuming the frequency of the noise signal does not change and a suitable multiplication factor was chosen for the correction function in block 132, the sampling interval will eventually converge on a value equal to one-sixteenth of the period of the noise signal. As a result, the averaged input signals should contain no trace of the alternating current noise and an adaptive digital filter according to the present invention will allow the detection of any change in an input signal which occurs for at least one-sixteenth of a cycle of the noise signal, or approximately seventeen milliseconds in North America. If is necessary to detect even shorter fluctuations in input signals, a shorter sampling interval, and if necessary a faster processor, may be utilized.

The many features and advantages of the present invention are apparent from the detailed specification, and, thus, it is intended by the appended claims to cover all such features and advantages of the filter which fall within the true spirit and scope of the invention. Further, since numerous modifications and changes will readily occur to those skilled in the art, it is not desired to limit the invention to the exact construction and operation illustrated and described, accordingly, all suitable modifications and equivalents may be resorted to, falling within the scope and spirit of the invention.

What is claimed is:

1. A filter for an input signal subjected to noise having a frequency, said filter comprising:
   reference input means for supplying a reference signal indicating the frequency of the noise;
   sampling means for receiving and sampling the input and reference signals at a sampling rate and for generating input and reference samples; and
   processor means for producing sums of the input and reference samples, respectively, generated during at least one cycle of the noise and for adjusting the sampling rate of said sampling means when the sum of the reference samples is not equal to zero.

2. A filter as recited in claim 1,
   wherein the input signal is supplied by an input line, operatively connected to said sampling means, extending along an input signal route, and
   wherein said reference input means comprises a reference line, operatively connected to said sampling means, extending substantially along the input signal route.

3. A filter as recited in claim 2, wherein the input line is shielded and said reference line is unshielded.

4. A filter as recited in claim 1,
   wherein the input signal is supplied by one of a plurality of input lines, and
   wherein said reference input means comprises a capacitor coupled to one of the input lines.

5. A filter as recited in claim 1, wherein said sampling means comprises an analog/digital converter operatively connected to said reference input means and said processor means.

6. A filter as recited in claim 5, wherein said sampling means further comprises a multiplexer operatively connected to said reference input means, said processor means, said analog/digital converter and to receive the input signal, said processor means controlling selection of the input and reference signals by said multiplexer.

7. A filter as recited in claim 6, wherein the sampling rate is controlled by said processor means to occur a number of times per cycle of the noise, the number being a multiple of two.

8. An adaptive digital filter for direct current analog input signals subjected to alternating current noise having a frequency, said filter comprising:
   reference input means for supplying a reference signal indicating the frequency of the alternating current noise;
   a multiplexer operatively connected to said reference input means and to receive the direct current analog input signals;
   an analog/digital converter, operatively connected to said multiplexer, for generating reference and input samples from the reference signal and the direct current analog input signals, respectively; and processor means for controlling said multiplexer and said analog/digital converter to sample the direct current analog input signals and the reference signal at a sampling rate, for producing sums of the input and reference samples, respectively, generated during each cycle of the alternating current noise and for adjusting the sampling rate, when the sum of the reference samples is not equal to zero, in a direction in which the reference samples will sum to zero.

9. A filter as recited in claim 8,
wherein the direct current analog input signals are supplied by shielded input lines, operatively connected to said multiplexer, extending along a substantially common route, and
wherein said reference input means comprises a reference line, operatively connected to said multiplexer, extending substantially along the common route of the shielded input lines.

10. A filter as recited in claim 8, wherein the alternating current noise has an expected frequency with a tolerance value and said processor means maintains the sampling rate within a sampling range at least as great as the tolerance range.

11. A filter as recited in claim 8,
wherein said processor means comprises means for averaging the sum of the input samples over each cycle of the alternating current noise, to generate averaged input signals, and
wherein said filter further comprises memory means for storing the averaged input signals.

12. A method of filtering an input signal to attenuate noise having a frequency, comprising the steps of:
 (a) supplying a reference signal representing the noise;
 (b) sampling the input and reference signals at a sampling rate;
 (c) calculating sums of the reference and input signal samples over at least one cycle of the noise; and
 (d) adjusting the sampling rate when the sum of the reference signal samples is not equal to zero.

13. A method as recited in claim 12, further comprising the step of (e) averaging the sum of the input signal samples for one cycle of the noise to produce a filtered signal.

* * * * *